United States Patent
Wiesmann et al.

(10) Patent No.: US 8,716,729 B2
(45) Date of Patent: May 6, 2014

(54) LIGHTING DEVICE

(75) Inventors: Burkard Wiesmann, Regensburg (DE); Herbert Brunner, Sinzing (DE); Joerg Strauss, Augsburg (DE); Julius Muschaweck, Gauting (DE); Kirstin Petersen, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 633 days.

(21) Appl. No.: 12/809,729

(22) PCT Filed: Dec. 11, 2008

(86) PCT No.: PCT/DE2008/002076
§ 371 (c)(1),
(2), (4) Date: Sep. 14, 2010

(87) PCT Pub. No.: WO2009/079990
PCT Pub. Date: Jul. 2, 2009

(65) Prior Publication Data
US 2011/0049551 A1 Mar. 3, 2011

(30) Foreign Application Priority Data

Dec. 21, 2007 (DE) .......................... 10 2007 062 048
Mar. 27, 2008 (DE) .......................... 10 2008 015 941

(51) Int. Cl.
*H01L 33/00* (2010.01)
(52) U.S. Cl.
USPC ...................... 257/98; 257/E33.061; 313/501
(58) Field of Classification Search
USPC ................ 257/98, E33.061; 438/29; 313/501
See application file for complete search history.

(56) References Cited

U.S. PATENT DOCUMENTS

| | | | |
|---|---|---|---|
| 2001/0001207 A1 * | 5/2001 | Shimizu et al. | 257/98 |
| 2002/0063301 A1 * | 5/2002 | Hanamoto et al. | 257/432 |
| 2003/0132701 A1 | 7/2003 | Sato et al. | |
| 2003/0178632 A1 * | 9/2003 | Hohn et al. | 257/99 |
| 2006/0071589 A1 * | 4/2006 | Radkov | 313/487 |
| 2007/0023762 A1 | 2/2007 | Gumins et al. | |
| 2007/0205711 A1 | 9/2007 | Takashima et al. | |
| 2008/0135862 A1 * | 6/2008 | Maeda et al. | 257/98 |
| 2009/0256166 A1 * | 10/2009 | Koike et al. | 257/98 |

FOREIGN PATENT DOCUMENTS

| | | |
|---|---|---|
| DE | 103 61 661 | 3/2005 |
| DE | 10 2005 007 601 | 9/2005 |
| DE | 10 2005 041 064 | 3/2007 |
| EP | 1 193 772 | 4/2002 |

(Continued)

*Primary Examiner* — Steven J Fulk
(74) *Attorney, Agent, or Firm* — Cozen O'Connor

(57) ABSTRACT

A lighting device (1) comprises at least one element (2) emitting light which is at least in part visible, and at least one conversion medium (3), which converts at least part of the radiation emitted by the element (2) into radiation of another frequency. In addition, the lighting device (1) comprises at least one filter medium (4) which filters at least part of the radiation, and which is configured such that the quantity of the conversion medium (4) to be used is reduced for at least one predetermined color saturation and/or one predetermined hue. This means that, compared with a light source corresponding to the lighting device (1) apart from the filter medium (4), savings are made in conversion medium (3) while achieving the same color saturation or the same hue. Light of a predetermined color saturation or of a predetermined hue may be efficiently generated by such a lighting device (1) and the lighting device (1) may be inexpensively produced. In operation, it also has high light intensities and a long service life.

16 Claims, 3 Drawing Sheets

(56) References Cited

FOREIGN PATENT DOCUMENTS

| EP | 1 403 689 | 9/2003 |
|---|---|---|
| EP | 1 685 746 | 11/2004 |
| EP | 1 830 418 | 9/2007 |
| JP | 2007-234877 | 9/2007 |
| WO | WO 2007018039 A1 * | 2/2007 |
| WO | WO 2007/039849 | 4/2007 |
| WO | WO 2007/125493 | 11/2007 |

* cited by examiner

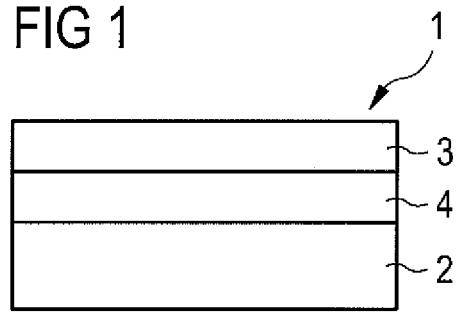
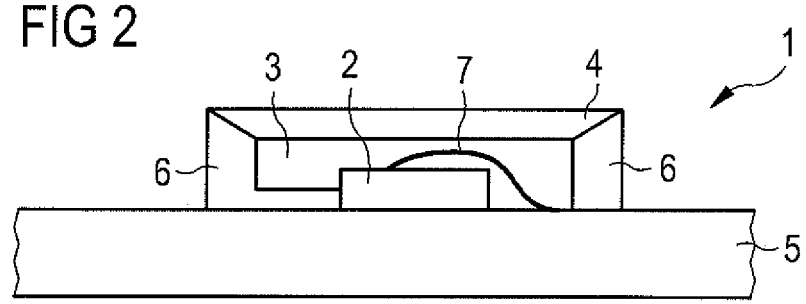
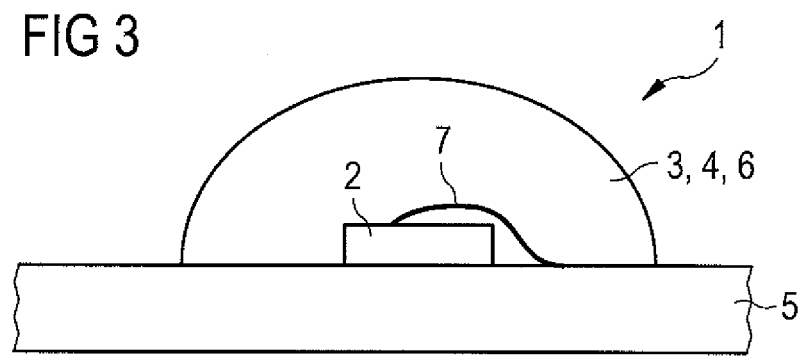

LIGHTING DEVICE

RELATED APPLICATIONS

This is a U.S. national stage of application No. PCT/DE2008/002076, filed on Dec. 11, 2008.

This patent application claims priority from German patent application no. 10 2007 062 048.0 filed Dec. 21, 2007 and 10 2008 015 941.7 filed Mar. 27, 2008, the disclosure content of both of which is hereby incorporated by reference.

FIELD OF THE INVENTION

The invention relates to a lighting device with an element emitting visible light, a conversion medium and a filter medium.

BACKGROUND OF THE INVENTION

In addition to radiant intensity, important parameters of light sources are the hue thereof and the colour saturation thereof. Precise adjustment of the latter two parameters is necessary in many applications, for example in light sources which are designed to replicate natural daylight as closely as possible. Apart from these white light sources, light is often required in just one specific spectral range, for example for projection purposes or for coloured display devices such as for instance advertising hoardings.

Typically, two different approaches are adopted in order to obtain light sources with the desired hue and the desired colour saturation. In the first case a light source is used which already emits light with the desired colour characteristics. Although radiation emitters emitting in different colours are technically producible in particular in the field of semiconductor light emitting diodes, purposeful adjustment of the colour is often possible only to a limited extent and may additionally be very complex. In the case of broadband-emitting white light sources such as for instance light bulbs, which may be regarded as black bodies, the achievable range of parameters for colour is limited physically by the thermal loading capacity of the materials used, while the "colour temperature" may be influenced only to a limited extent. In the second case the desired spectral range is achieved by way of a conversion medium, which modifies the original wavelength of the light emitted by the source. Conversion media or luminescent materials must satisfy stringent requirements with regard to efficiency or quantum yield and to thermal, light or chemical stability, must as a rule be inexpensive to produce and also easy to fix to the light source. Achieving all these characteristics, in particular purposeful tuning of the spectrum emitted by the conversion medium, is often difficult, complex and costly. However, there are often limits to what can be achieved.

Colour filters are also often used, which only transmit light in a specific wavelength range and so influence hue and colour saturation. Filter media or absorbers are usually much easier to tailor to requirements with regard to colour properties than are conversion media. However, the use of filters is as a rule associated with losses in terms of light intensity. Since, however, considerable importance is attached to the efficiency of a light source, filter media are typically not regarded as the ideal solution.

SUMMARY OF THE INVENTION

An object of the invention is to provide a lighting device which efficiently emits radiation with a predetermined colour saturation or a predetermined hue and which may be inexpensively produced.

In accordance with one aspect of the invention, a lighting device comprises at least one element emitting light which is at least in part visible, and at least one conversion medium, which converts at least part of the radiation emitted by the element into radiation of another frequency. In addition, the lighting device comprises at least one filter medium different from the conversion medium, which filter medium filters at least part of the radiation emitted by the element, in particular a longwave part, and which is configured such that the quantity of the conversion medium to be used is reduced for at least one predetermined colour saturation and/or one predetermined hue. This means that, compared with a light source corresponding to the lighting device apart from the filter medium, savings are made in conversion medium while achieving the same colour saturation or the same hue. Light of a predetermined colour saturation or of a predetermined hue may be efficiently generated by such a lighting device and the lighting device may be inexpensively produced. In operation, it also has high light intensities and a long service life.

The fact that the hue and/or the colour saturation, i.e. in particular the colour location of the radiation in the CIE standard colour chart, is predetermined preferably means that a desired colour location is achieved with a tolerance of at most 0.03 units of the standard colour chart, particularly preferably of at most 0.02 units, in particular of at most 0.015 units. In other words, the colour location of the emitted radiation lies within a circle or on a circle with one of the indicated radii around the desired colour location. The desired colour location is for example predetermined by a specific application of the lighting device.

Conversion media or luminescent materials are based as a rule on the principle of fluorescence, i.e. the conversion medium absorbs light approximately in the blue or ultraviolet spectral range. In comparison with the absorbed light, the wavelengths of the fluorescent light are shifted into the red towards longer wavelengths. The absorption spectrum and fluorescence spectrum typically overlap in a spectral range. If a high concentration or a large quantity of the conversion medium is used, the result is that a part of the fluorescent light which falls within the spectral range in which the conversion medium both absorbs and fluoresces is reabsorbed again by the conversion medium. Depending on the precise shape of the absorption and fluorescence spectra, this reabsorption significantly reduces the luminance of a light source. This effect occurs in particular when light-emitting diodes emitting for instance blue light are used and their light is converted for instance into the green or red spectral range. In order fully to absorb the blue light and thus for instance to achieve the desired colour saturation, typically such high concentrations or quantities of the conversion agent have to be used that reabsorption has a markedly disadvantageous effect on the light intensity of such a light source. This effect may be reduced or sidestepped by the described use of an additional filter medium.

The radiant intensity of a lighting device is high in particular when the radiant intensity absorbed by the filter is lower or markedly lower than the intensity which would be reabsorbed by the saved quantity of conversion medium. "Markedly" may mean, for example, a difference of at least 10%, in particular of at least 15%. Despite the use of a filter medium and although a smaller quantity of conversion medium is used, this means that, at an identical colour location of the emitted radiation, the emitted radiant intensity is greater.

Particularly high intensities may be achieved if the ratio between filter medium and conversion medium is optimised with regard to radiant intensity. In addition, the costs associated with the conversion medium and with operation of the lighting device are reduced.

Optimised means for example that, by varying the quantity of conversion medium, no increase in the intensity of the radiation emitted by the lighting device can be achieved. Hue and/or colour saturation, i.e. in particular the colour location of the radiation, do not change, within a tolerance of for example 0.02 units or 0.015 units in the CIE standard colour chart. The filter medium and the radiation-emitting element are likewise not subject to any change with regard to their spectral characteristics. In other words, optimised may mean that the intensity of the emitted radiation cannot be further increased solely by varying the quantity or concentration of the conversion medium.

By using a light-emitting diode as electromagnetic radiation-emitting element, a high efficiency lighting device may be produced. Because of the typically comparatively small geometric dimensions of a light-emitting diode, which are generally of the order of millimeters, compact light sources may additionally be produced.

According to at least one embodiment of the lighting device the intensity of the radiation emitted by the lighting device is greater than that of a corresponding lighting apparatus in which the filter medium is replaced by an increased quantity of conversion medium. In particular, this intensity of the radiation emitted by the lighting device is at least 2.5%, preferably at least 6.5%, in particular at least 12.5% greater than with a lighting apparatus modified as indicated. In other words, the radiant intensity of the lighting device comprising the filter medium and comparatively small quantity of conversion medium, is compared with the radiant intensity of a lighting apparatus not comprising such a filter medium but a comparatively large quantity of conversion medium.

If the element emits substantially in the ultraviolet or in the blue spectral range, a plurality of luminescent materials or conversion media may be used, and a large spectral range is obtainable. The element preferably emits radiation with a wavelength of at least 440 nm. For example, the radiation emitted by the element has an intensity maximum between 450 nm and 470 nm inclusive.

If the lighting device comprises a substrate on which the element is fixed, the lighting device is simpler to handle. In particular, substrates may be used which exhibit a high thermal conductivity or for instance are mechanically flexible.

If the lighting device comprises a potting compound, in which the element is at least partially embedded, the element may for instance be fixed simply to the substrate. In addition, the options for configuring the lighting device by shaping the potting compound are considerably widened.

By using a filter medium made from a polymer or glass filter, the filter medium may be readily integrated into a lighting device. In addition, numerous such filters are available, such that it is simple to select a suitable filter. Material filters such as for example titanium dioxide particles may also be used.

If the filter medium is a Bragg filter or a dielectric filter, the transmission range of the filter medium may be efficiently adjusted and precisely set. In this case the filter medium preferably comprises a plurality of layers with an alternately high and low refractive index. Such a filter medium may in particular take the form of a bandpass filter.

By applying the filter medium partially or completely between the element and conversion medium, the light to be filtered is absorbed upstream of the conversion medium layer. The intensity to which the conversion medium is exposed is thus reduced and an increase in the service life of the conversion medium is thereby achieved. In this case the filter medium preferably takes the form of a bandpass filter.

According to at least one embodiment of the lighting device, there is no gap which has been evacuated or filled with a gas between the element and the filter medium. In this way, significant reflection of the radiation, for instance at an air/filter medium boundary surface, may be avoided.

According to at least one embodiment of the lighting device, the colour saturation of the radiation emitted by the lighting device amounts to at least 80%, in particular at least 85%. In other words, the distance between the colour location of the radiation and the white point in the CIE standard colour chart is at least four times as large as the distance between the colour location and the associated hue. The associated hue is here the point of intersection, closest to the colour location, of a straight line, defined by the colour location of the radiation and the white point, with the spectral colour line in the CIE standard colour chart.

According to at least one embodiment of the lighting device, the hue of the radiation emitted by the lighting device has a wavelength of between 545 nm and 585 nm inclusive, in particular between 550 nm and 575 nm inclusive. It is in precisely this spectral range that semiconductor chips based on InGaN and InGaAlP exhibit comparatively low efficiency. By using a conversion medium for generating radiation in particular in this spectral range, the efficiency of the lighting device may be increased.

If the filter medium is made from a dye or pigment added to the substrate and/or the potting compound, the manufacturing complexity of the lighting device is reduced, since a separate step of applying the filter medium may be dispensed with. Preferably, the filter medium effects narrowband absorption in the transition region between absorption and fluorescence of the conversion medium. Manufacturing effort is likewise reduced if the conversion medium is added to the substrate or potting compound.

Suitable materials preferred as a potting compound and as a matrix material for filter media and/or conversion media are silicones, epoxides, silicone hybrid materials, glasses or transparent or translucent ceramics.

If the conversion medium is designed to absorb blue or ultraviolet light, light-emitting diodes emitting in the blue range and based on gallium nitride may be used, these being a widespread and inexpensive semiconductor component. In addition, substantially any visible spectral colour may be generated by means of blue or ultraviolet light, for instance by means of fluorescence.

Making the conversion medium from at least one fluorescent or phosphorescent substance means that a large range of existing conversion media is available, such that the lighting device may be variably configured and inexpensively produced.

If the conversion medium is designed to emit radiation substantially in the green and/or in the yellow and/or in the red spectral range, it is possible, for instance with the addition of a blue light-emitting diode, to produce a white-emitting lighting device or indeed an "RGB module".

Lighting devices with particularly high intensities may be produced, if the reduction in intensity of the already converted radiation by reabsorption of the conversion medium amounts to less than 10%, particularly preferably less than 5%, very particularly preferably less than 1%. The proportion reabsorbed may for example be determined from multiplication of an emission spectrum of the already converted radiation with the absorption spectrum of the conversion medium.

In the case of the absorption spectrum, absolute absorption values, as a function of wavelength, should in particular be taken in consideration.

According to at least one embodiment of the lighting device, the conversion medium is formed by a matrix material and in particular by inorganic luminescent material particles embedded therein. The proportion by weight of the luminescent material particles, which is reduced by the use of the filter medium, is preferably between 11% and 16% inclusive, in particular between 13% and 14.5% inclusive.

In at least one embodiment of the lighting device, said device comprises at least one element emitting light which is at least in part blue. In addition, the lighting device contains at least one conversion medium with a matrix material and luminescent material particles embedded therein. The conversion medium absorbs at least part of the blue light emitted by the element and converts it into radiation of a different, lower frequency. In addition the lighting apparatus comprises at least one filter medium different from the conversion medium, which filter medium takes the form of an edge filter or bandpass filter. The proportion by weight of the luminescent material particles in the conversion medium is preferably between 11% and 16% inclusive. The filter medium filters at least a longwave part of the radiation emitted by the element. In such a lighting device, the quantity of the conversion medium to be used is reduced due to the filter medium and in this way efficiency is increased.

BRIEF DESCRIPTION OF THE DRAWINGS

The invention is described below by way of exemplary embodiments with reference to the drawings. Elements which are the same in the individual figures are indicated with the same reference numerals. The features shown on the drawings are, however, not to scale relative to one another.

In the drawings:

FIG. 1 is a schematic side view of an exemplary embodiment of a lighting device described herein, FIG. 2 is a schematic side view of an exemplary embodiment with a substrate and a potting compound, FIG. 3 is a schematic side view of an exemplary embodiment in which the filter and conversion media are integrated into the potting compound.

DETAILED DESCRIPTION OF THE DRAWINGS

FIG. 1 shows a first exemplary embodiment of a lighting device 1. The filter medium 4 is situated in a layer between the light-emitting element 2 and conversion medium 3 and takes the form of a thin polymer filter. The light-emitting element 2 takes the form of a gallium nitride-based light-emitting diode, which emits substantially in the blue spectral range. The conversion medium 3 absorbs in the blue and emits substantially in the green spectral range. The filter medium 4 effects narrowband absorption in the spectral range in which absorption and fluorescence of the conversion medium 3 overlap. Absorption of the conversion medium 3 is relatively low in this overlap region. For this reason, the photons emitted in this spectral range by the element 2 cannot all be converted by the conversion medium 3. It is precisely these non-convertible photons which are absorbed by the filter medium 4.

In contrast to the illustration according to FIG. 1, it is possible for the positions of the filter medium 4 and the conversion medium 3 to be switched.

Figure 7A:
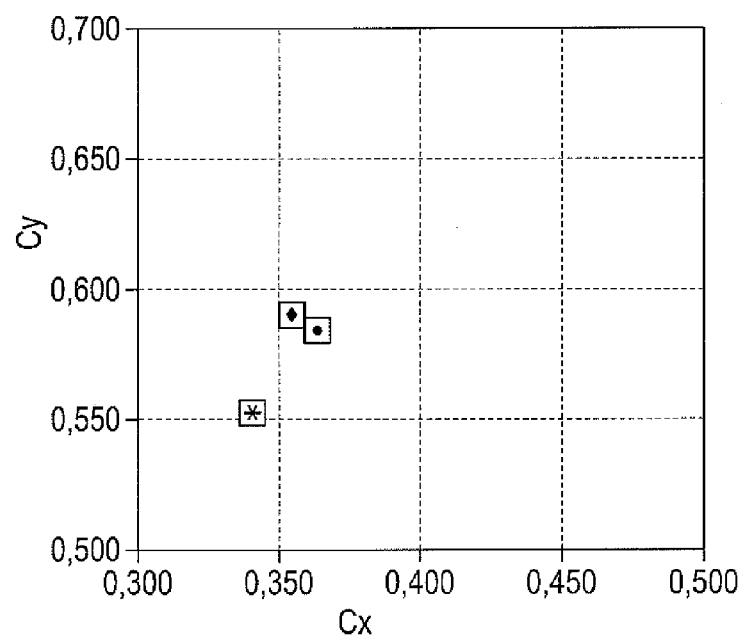
FIG. 7 is an illustration with the help of a portion of the standard colour chart a) and associated emission spectra b).

The mode of operation of the filter medium 4 is illustrated in FIG. 7. FIG. 7A shows a portion of the standard colour chart. The results of three series of measurements with different filter or conversion media configurations were plotted, wherein in each case elements 2 of identical structure and operation were used in an arrangement similar to that in FIG. 2. The respective measurements are scattered around a mean. In measurement series I a high conversion medium concentration was selected and a filter medium 4 was not used. The associated mean is symbolised by a solid circle, the scatter by a square. In measurement series II lighting devices 1 with a reduced conversion medium concentration were measured, without filter medium 4. The result was a substantial change in colour saturation, with the associated measurement point, symbolised by a star, being located more towards the origin of the standard colour chart. If, as in measurement series III, a filter medium 4 is applied to this arrangement with a low concentration of conversion medium 3, the associated measurement point, symbolised by a solid rhombus, is located in the vicinity of the result of measurement series I. Measurement series I and III thus have substantially identical colour saturation and identical hue.

Figure 7B:
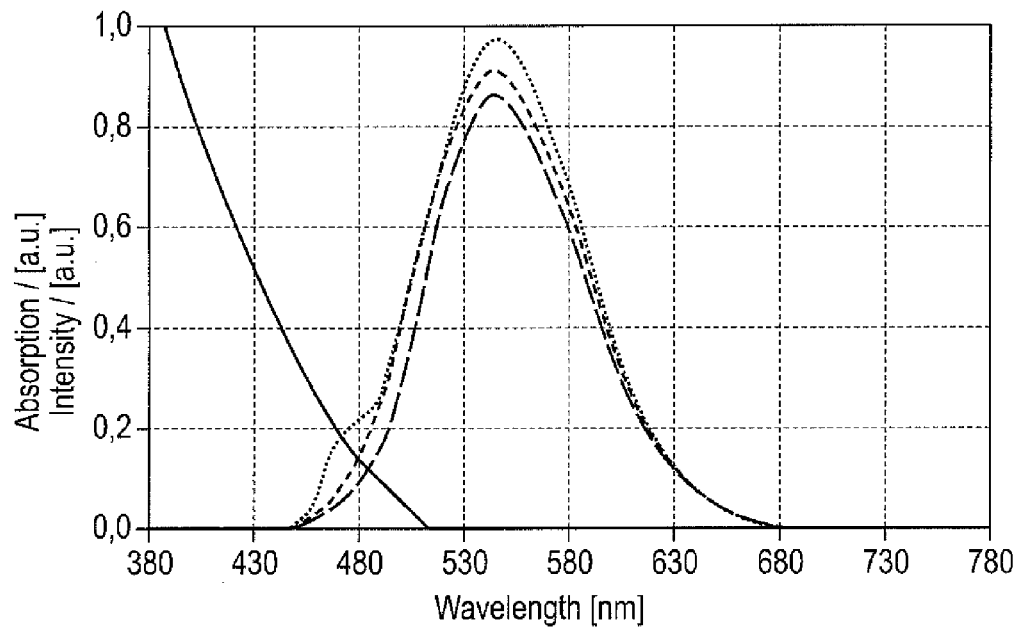

In FIG. 7B the emission spectra associated with the three measurement series are indicated as broken lines:

measurement series I, high conversion medium concentration without filter medium, printed as a bold dashed line, measurement series II, low conversion medium concentration without filter medium 4, printed as a dotted line, measurement series III, low conversion medium concentration with filter medium 4, printed as a normal dashed line. The absorption spectrum of the conversion medium 3 is indicated as a continuous line. The conversion medium 3 absorbs in the shortwave range substantially below 500 nm. The emission spectra, which are arbitrarily scaled to one another, for the measurement series in each case exhibit a maximum in the region of 550 nm in the green spectral range. In the region around 480 nm on the shortwave emission slopes, there are distinct differences between the three measurement series. Because of the elevated conversion medium concentration, which causes significant absorption up to approx. 500 nm, the emission of the lighting device 1 according to measurement series I is markedly reduced in the spectral range below around 500 nm in comparison with measurement series II and III. Measurement series II exhibits a markedly greater intensity in the region of 475 nm, which leads to the shift in the standard colour chart shown in FIG. 7A. The original position in the standard colour chart according to measurement series I may be re-established by a suitable filter medium 4, in measurement series III an edge filter, which filters light below approx. 490 nm. The lower conversion medium concentration in measurement series III significantly reduces reabsorption of the already converted radiation by the conversion medium 4. This means that, despite the use of a small quantity of conversion medium 3 and despite use of a filter medium 4, the intensity of the light emitted by the lighting device from measurement series III is increased by an average of above ten percent compared with measurement series I. This means that absorption by the filter medium 4 is more than compensated by the reduced reabsorption by the conversion medium 3. Significantly higher intensities are thus achieved, this being the case at a predetermined colour saturation and predetermined hue.

This effect, that a higher intensity of radiation emitted by the lighting device 1 may be achieved despite the filter medium 4 and despite less conversion medium 3, may be demonstrated for example as follows: First of all, the radiant intensity $I_{filter}$ emitted by a lighting device 1 described herein and the colour location of the emitted radiation in the CIE standard colour chart are measured. The filter medium 4 is then removed, so as to obtain a modified lighting apparatus. The film thickness and/or concentration of conversion medium 3 is then increased by the addition of a further quantity of conversion medium 3 until the radiation emitted by this modified lighting apparatus displays, with a certain tolerance, the same colour location as the radiation emitted by the original lighting device 1. Finally, the radiant power $I_{mod}$ emitted by the modified lighting apparatus is measured and compared with the radiant power $I_{filter}$ emitted by the original lighting device 1. If $I_{filter}$ is then, for example, greater by for instance at least 5% or at least 10% than $I_{mod}$, the lighting device 1 is as described herein.

The present lighting device 1 may be produced substantially for each spectral range in the visible range. Since suitable absorbers are considerably more readily available than corresponding conversion media 4, general application is possible. It goes without saying that the variants shown in the various exemplary embodiments may be combined with one another.

The lighting device 1 according to FIG. 2 comprises a substrate 5 and a potting compound 6. Electrical contacting of the element 2 proceeds via electrical conductors, not shown in FIG. 2, mounted on the substrate 5, and via a bonding wire 7, which leads from the substrate 5 to the side of the element 2 remote from the substrate 5. The trough-like structure formed by the potting compound 6 is filled with a conversion medium 3. The filter medium 4 is applied as a covering layer on the side of the conversion medium 3 remote from the substrate 5.

For example, the element 2 is a light-emitting diode chip based on InGaN, which exhibits maximum emission at a wavelength of around 460 nm. The conversion medium 3 comprises luminescent material particles with an average diameter of approx. 1 μm to 10 μm, which particles contain europium-doped silicon oxynitride, the luminescent material particles being embedded in a matrix material comprising a silicone. The proportion by weight of the luminescent material particles in the overall conversion medium 3, consisting of the luminescent material particles and the matrix material, amounts to around 14%. The thickness of the conversion medium 3, measured in a direction parallel to a growth direction of the for example epitaxially produced element 2, may be around 500 μm.

The filter medium 4 is formed by a glass filter, which comprises an absorption edge of around 475 nm to 480 nm. In the spectral range of below around 475 nm, the filter medium 4 has an absorbing action in particular for a longwave fraction of the radiation emitted by the element 2. In the visible spectral range above around 480 nm, the filter medium 4 is transparent or translucent. The filter medium 4 is for example a yellow glass filter GG475 from ITOS, Germany.

A hue of the radiation emitted by the lighting device 1 is around 560 nm and colour saturation is around 85%. This high colour saturation may likewise be achieved by using the filter medium 4.

In the exemplary embodiment according to FIG. 3, both filter medium 4 and conversion medium 3 were integrated into the potting compound 6 of the lighting device 1. The potting compound 6 takes the form of a lens, which focuses the light emitted by the element 2 and converted by the conversion medium 3 into specific spatial regions. The element 2 is a light-emitting diode. Electrical contacting proceeds via a bonding wire 7 to the substrate, on which are located electrical contacting means and conductors which are not shown.

As an alternative to the arrangement shown in FIG. 3, a lens-like structure of the potting compound or of the conversion medium 3 or filter medium 4 may also be produced for the lighting devices 1 shown in FIGS. 1 and 2. If the lens shape is formed from a separate potting compound 6, which does not comprise any conversion medium 3 or filter medium 4, a more uniform spatial radiation pattern may be achieved for the lighting device 1. In addition to a simple lens, Fresnel zones may also be formed, for example. The conversion medium 3 may optionally be made not from a fluorescent medium but rather for instance from a photonic crystal or a medium with an optically non-linear action.

As an alternative to the element 2 used according to FIG. 3, the electrical contacting means of which are provided on the two opposing main sides of the element 2, elements 2 may also be used whose contacting means are mounted for instance on just one main side or indeed on the lateral sides of the element 2. The element 2 may also take the form of a thin film or substrate-less, unilaterally or bilaterally emitting diode. It is also not essential for the element 2 to take the form of a light-emitting diode.

Figure 4:
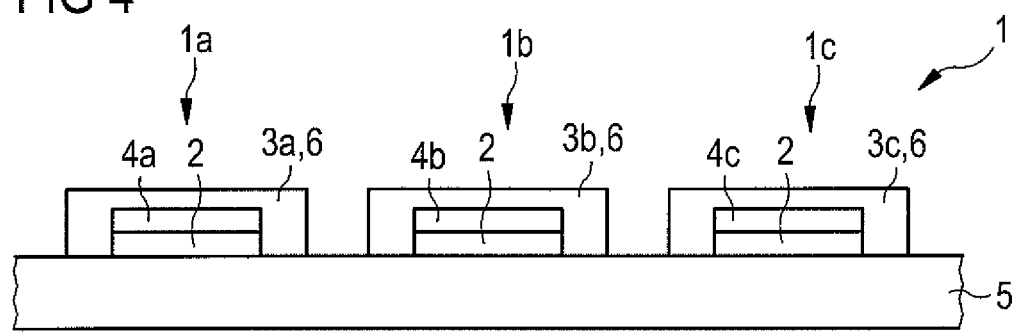
FIG. 4 is a schematic side view of an exemplary embodiment with a plurality of light-emitting elements.

A lighting device 1 comprising a plurality of light-emitting elements 2 is shown in FIG. 4. Electrical contacting means and conductors are not shown. The light-emitting elements 2 are mounted on a main side of a flat, thermally conductive substrate 5. Various filter media 4a, b, c are applied extensively on the side of the elements 2 remote from the substrate 5. Various conversion media 3a, b, c are introduced into a potting compound 6, such that the different units 1a, b, c containing the elements 2 may emit in various colours. Filter media 4a, b, c and conversion media 3a, b, c are in each case tuned to one another in such a way as to produce an "RGB module". It goes without saying that the units 1a, b, c may also be mounted other than in the arrangement shown, for instance on both main sides of the substrate 5. The colour of the units 1a, b, c is also not limited to red, green or blue. The number of units 1a, b, c or of elements 2 may likewise vary.

Figure 5:
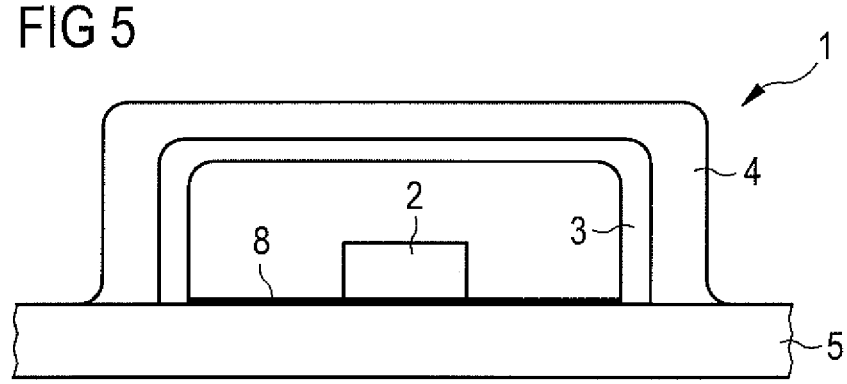
FIG. 5 is a schematic a side view of a further exemplary embodiment.

According to FIG. 5, the conversion medium 3 and filter medium 4 form a cap-like cover, within which the element 2 is located on a substrate 5. The load-bearing material of the cover is formed by means of the filter medium 4, which takes the form of a glass filter. A layer of a conversion medium 3 is located on the inside of the filter medium 4. The cover, which provides protection from mechanical stresses and from environmental influences such as moisture, is attached to the substrate 5 by adhesive bonding. A metallic layer 8 is applied to the substrate 5 in the region in which the element 2 is mounted, which metallic layer 8 forms electrical contacting means, not shown, and reflects the light, emitted towards the substrate 5 by the element 2, towards the filter medium 4.

Figure 6:
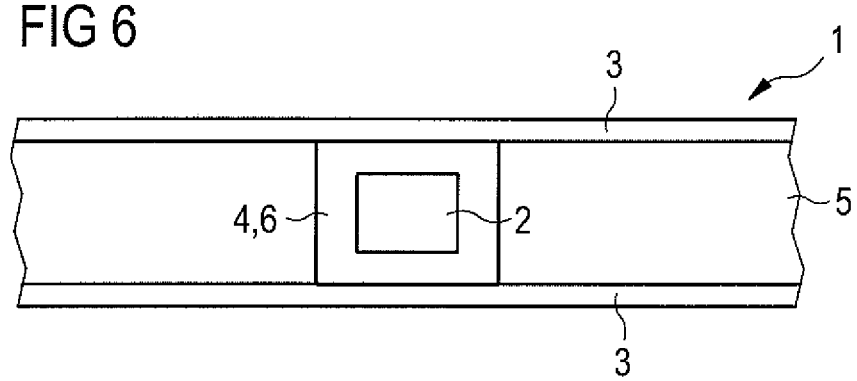
FIG. 6 is a schematic side view of an exemplary embodiment in which the element is embedded in a substrate.

The lighting device 1 according to FIG. 6 comprises a substrate 5, which is provided with at least one recess. Within this recess is placed the light-emitting element 2, which is surrounded by a potting compound 6, which comprises the filter medium 4. The substrate 5 is made from a transparent material such as for instance glass or a plastics material. Layers of a conversion medium 3 are applied to the main sides of the substrate 5. In this way, an extensively emitting lighting device 1 may be realised which emits light towards both sides. The electrical contacting means, not shown, of the element 2 may be made of a transparent material such as indium tin oxide and extend on the main sides of the substrate 5 between the latter and the extensive layers of the conversion medium 3. It goes without saying that a plurality of elements 2 may be integrated into the substrate 5. The use of different elements 2, conversion media 3 and filter media 4 in different regions of the substrate 5 is also possible, as in the exemplary embodiment shown in FIG. 4.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. A lighting device comprising:
   at least one element emitting light which is blue radiation with an intensity maximum between 450 nm and 470 nm;
   at least one conversion medium, which converts at least part of the radiation emitted by the element into radiation of a different frequency; and
   at least one filter medium, which filters only in a spectral sub-range of the blue radiation and in a spectral range in which an absorption and a fluorescence of the conversion medium overlap, and which is configured such that the quantity of the conversion medium to be used is reduced for at least one predetermined color saturation and one predetermined hue, the color saturation being at least 85% and the hue being between 545 nm and 585 nm inclusive,
   wherein the filter medium is mounted between the element and the conversion medium.

2. The lighting device according to claim 1, wherein the radiant intensity absorbed by the filter medium is lower than the intensity which would be reabsorbed by the saved quantity of conversion medium.

3. The lighting device according to claim 1, wherein the radiant intensity emitted by the lighting device is greater than that of a corresponding lighting apparatus in which the filter medium is replaced by an increased quantity of conversion medium.

4. The lighting device according to claim 1, wherein the intensity of the already converted radiation is reduced by at most 10% by reabsorption by the conversion medium.

5. A lighting device comprising:
   at least one element emitting light which is at least in part blue radiation;
   at least one conversion medium with a matrix material and luminescent material particles embedded therein, which absorbs at least part of the blue light emitted by the element and converts it into radiation of a different, lower frequency; and
   at least one filter medium different from the conversion medium, which filter medium takes the form of a bandpass filter,
   wherein the proportion by weight of the luminescent material particles in the conversion medium is between 11% and 16% inclusive,
   wherein the filter medium only filters a longwave part of the blue radiation emitted by the element,
   wherein the conversion medium shows an emission maximum upon excitation with the blue radiation at about 550 nm, and
   wherein the filter medium is mounted between the element and the conversion medium.

6. The lighting device according to claim 5, wherein the radiant intensity absorbed by the filter medium is lower than the intensity which would be reabsorbed by the saved quantity of conversion medium.

7. The lighting device according to claim 5, wherein the ratio between filter medium and conversion medium is optimised with regard to radiant intensity.

8. The lighting device according to claim 5, wherein the element is a light-emitting diode emitting only blue light.

9. The lighting device according to claim 5, wherein the radiant intensity emitted by the lighting device is greater than that of a corresponding lighting apparatus in which the filter medium is replaced by an increased quantity of conversion medium.

10. The lighting device according to claim 5, which comprises a potting compound, wherein the element is at least partially embedded.

11. The lighting device according to claim 5, wherein the filter medium takes the form of a Bragg, polymer and/or glass filter.

12. The lighting device according to claim 5, wherein the filter medium is made from a dye or pigment added to the substrate and/or the potting compound.

13. The lighting device according to claim 5, wherein the conversion medium is added to the substrate and/or the potting compound.

14. The lighting device according to claim 5, wherein the intensity of the already converted radiation is reduced by at most 10% by reabsorption by the conversion medium.

15. A lighting device comprising:
   at least one element emitting light which is at least in part visible and which comprises blue radiation;
   at least one conversion medium, which converts at least part of the radiation emitted by the element into radiation of a different frequency; and
   at least one filter medium, which filters at least part of the blue radiation emitted by the element and which is configured such that the quantity of the conversion medium to be used is reduced for the predetermined color saturation and predetermined hue, the color saturation being about 85% and the hue being about 560 nm,
   wherein the filter medium takes the form of a layer and is mounted completely between the element and the conversion medium,
   wherein the filter medium effects narrowband absorption only in a spectral range in which an absorption and a fluorescence of the conversion medium overlap, and
wherein the conversion medium follows the filter medium in a direction away from the element.

16. The lighting device according to claim 15,
   wherein the filter medium is a bandpass filter as well as a polymer filter, and
   wherein the light emitted by the element has an intensity maximum between 450 nm and 470 nm inclusive.

* * * * *